(12) United States Patent
Eom

(10) Patent No.: US 9,761,579 B2
(45) Date of Patent: Sep. 12, 2017

(54) C-SHAPED RESISTOR AND SEMICONDUCTOR DEVICE INCLUDING THE SAME

(71) Applicant: SK hynix Inc., Icheon-si, Gyeonggi-do (KR)

(72) Inventor: Dae Sung Eom, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/838,929

(22) Filed: Aug. 28, 2015

(65) Prior Publication Data
US 2015/0371988 A1 Dec. 24, 2015

Related U.S. Application Data

(62) Division of application No. 14/483,561, filed on Sep. 11, 2014, now Pat. No. 9,153,488.

(30) Foreign Application Priority Data
Apr. 16, 2014 (KR) ........................ 10-2014-0045556

(51) Int. Cl.
| | | |
|---|---|---|
| H01L 27/06 | (2006.01) |
| H01L 29/423 | (2006.01) |
| H01L 29/78 | (2006.01) |
| H01L 21/768 | (2006.01) |
| H01L 49/02 | (2006.01) |

(52) U.S. Cl.
CPC .... *H01L 27/0629* (2013.01); *H01L 21/76897* (2013.01); *H01L 28/20* (2013.01); *H01L 29/4232* (2013.01); *H01L 29/7827* (2013.01)

(58) Field of Classification Search
CPC ................ H01L 28/20; H01L 27/0629; H01L 21/76897; H01L 27/0802; H01L 27/10855; H01L 23/647
See application file for complete search history.

(56) References Cited

U.S. PATENT DOCUMENTS

| | | | | |
|---|---|---|---|---|
| 4,792,781 A * | 12/1988 | Takahashi | ............ | H01C 17/006 29/610.1 |
| 5,770,993 A * | 6/1998 | Miyazawa | ............... | H01C 7/13 337/142 |
| 6,570,210 B1 * | 5/2003 | Sowlati | .................. | H01L 28/82 257/303 |
| 6,859,133 B2 * | 2/2005 | Nakanishi | ............... | H01C 7/003 338/309 |
| 7,456,075 B2 * | 11/2008 | Sasaki | ................. | H01L 27/0802 257/537 |
| 7,705,459 B2 * | 4/2010 | Kim | .................. | H01L 21/31116 257/754 |
| 8,415,242 B2 * | 4/2013 | Mizushima | ....... | H01L 27/11578 257/E21.409 |
| 8,890,251 B2 * | 11/2014 | Lee | ..................... | H01L 29/4238 257/364 |

(Continued)

*Primary Examiner* — Mohsen Ahmadi
(74) *Attorney, Agent, or Firm* — William Park & Associates Ltd.

(57) ABSTRACT

A resistor includes a first conductive layer; a second conductive layer protruding from the first conductive layer; a third conductive layer located above and facing the first conductive layer to face the first conductive layer; and at least two contact plugs electrically coupled to the third conductive layer.

7 Claims, 14 Drawing Sheets

(56) References Cited

U.S. PATENT DOCUMENTS

| | | | | |
|---|---|---|---|---|
| 8,901,707 B2* | 12/2014 | Park | ............... | H01L 27/0805 |
| | | | | 257/532 |
| 9,018,611 B2* | 4/2015 | Kawai | ............ | H01L 45/1253 |
| | | | | 257/2 |
| 9,202,536 B2* | 12/2015 | Helm | .................. | G11C 7/18 |
| 9,514,867 B2* | 12/2016 | Harada | ............ | H01C 17/006 |
| 2002/0015293 A1* | 2/2002 | Akiba | ............ | H01L 23/5383 |
| | | | | 361/793 |
| 2004/0070033 A1* | 4/2004 | Shin | ............... | H01L 27/0629 |
| | | | | 257/379 |
| 2004/0174655 A1* | 9/2004 | Tsai | ............... | H01L 23/5223 |
| | | | | 361/306.3 |
| 2006/0208338 A1* | 9/2006 | Lee | .................. | B82Y 10/00 |
| | | | | 257/516 |
| 2007/0158783 A1* | 7/2007 | Chen | ............. | H01L 23/5223 |
| | | | | 257/534 |
| 2008/0308783 A1* | 12/2008 | Ahn | ............... | G11C 13/0007 |
| | | | | 257/2 |
| 2009/0283739 A1* | 11/2009 | Kiyotoshi | ......... | H01L 27/0688 |
| | | | | 257/4 |
| 2010/0188799 A1* | 7/2010 | Galvagni | .......... | H01G 4/012 |
| | | | | 361/306.3 |
| 2011/0286261 A1* | 11/2011 | Sakaguchi | ....... | G11C 13/0004 |
| | | | | 365/148 |
| 2013/0049846 A1* | 2/2013 | Jang | .................. | H01L 28/20 |
| | | | | 327/538 |
| 2013/0193503 A1* | 8/2013 | Lee | ............. | H01L 27/11582 |
| | | | | 257/314 |
| 2015/0371988 A1* | 12/2015 | Eom | ............. | H01L 21/76897 |
| | | | | 257/379 |

\* cited by examiner

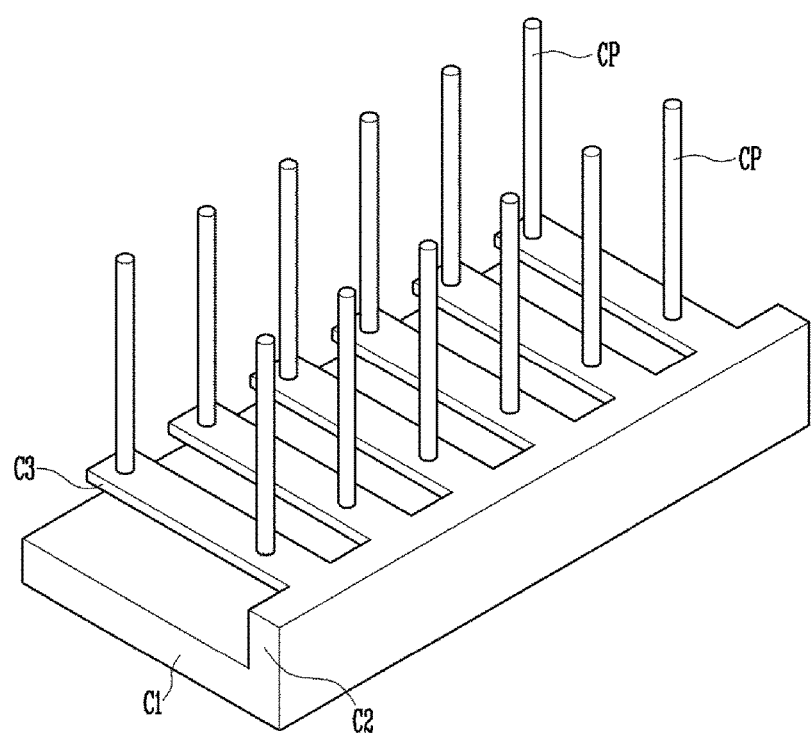

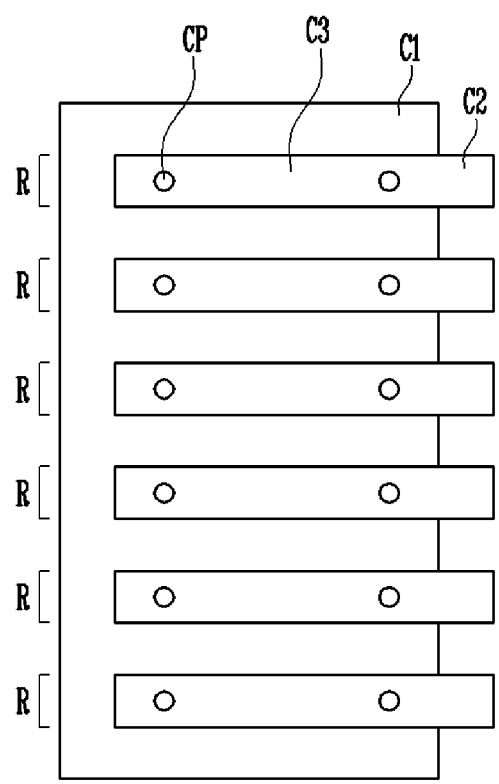

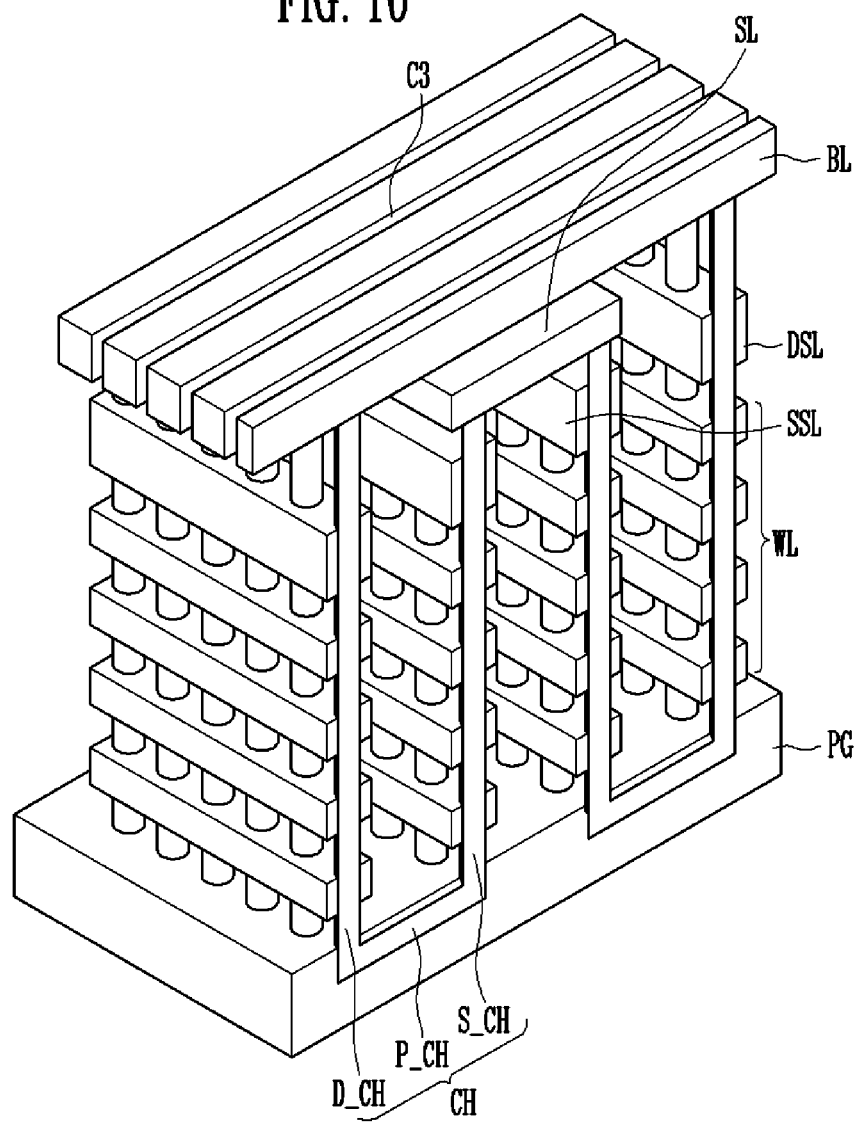

C-SHAPED RESISTOR AND SEMICONDUCTOR DEVICE INCLUDING THE SAME

CROSS-REFERENCE TO RELATED APPLICATION

The present application claims priority to Korean patent application number 10-2014-0045556, filed on Apr. 16, 2014, the entire disclosure of which is incorporated herein in its entirety by reference.

BACKGROUND

Field of Invention

Various embodiments of the invention relate to a semiconductor device and a method for manufacturing the same, and more particularly, to a resistor and a method for manufacturing the same.

Description of Related Art

A nonvolatile memory device is a memory device that maintains data stored even when power is cut off. As improvement on the degree of integration of 2-dimensional volatile devices where memory cells are formed in a single layer on a substrate reached its limitations, a 3-dimensional memory device that laminates memory cells on a substrate perpendicularly is being proposed.

Herein, a nonvolatile memory device having a 3-dimensional structure includes a resistor for adjusting the operating speed of the memory device and the current amount flowing in a circuit. However, since the resistor has a single-layered structure unlike memory cells that are laminated in a 3-dimensional structure, the resistor needs to be formed in an additional process. Therefore, the manufacturing process becomes complicated and costs increase.

SUMMARY

An embodiment of the invention provides a resistor, including: a first conductive layer; a second conductive layer protruding from the first conductive layer; a third conductive layer electrically coupled to the second conductive layer, and located above and facing the first conductive layer; and at least two contact plugs electrically coupled to the third conductive layer.

An embodiment of the invention provides a semiconductor device including: a first conductive layer; at least one second conductive layer protruding from the first conductive layer; a plurality of third conductive layers electrically coupled to the at least one second conductive layer, and located above and facing the first conductive layer; and a plurality of contact plugs electrically coupled to the third conductive layers.

An embodiment of the invention provides a method for manufacturing a semiconductor device, the method including: forming a first conductive layer including a first trench; forming a sacrificial layer in the first trench; forming a second conductive layer on the first conductive layer where the sacrificial layer is formed; forming a second trench by patterning the first conductive layer in a plate shape, patterning the second conductive layer in a plurality of lines, and penetrating the first and second conductive layers to expose the sacrificial layer; removing the sacrificial layer through the second trench; and forming an insulating layer in the first and second trench.

BRIEF DESCRIPTION OF THE DRAWINGS

FIG. 2A is a perspective view of a resistor region of a semiconductor device according to an embodiment of the invention.

FIG. 3A to FIG. 8A and FIG. 3B to FIG. 8B are process cross-sectional views for explaining a method for manufacturing a semiconductor device according to an embodiment of the invention;

FIG. 9B is a layout of FIG. 9A;

FIG. 10 is a perspective view illustrating a cell region of a semiconductor device according to an embodiment of the invention;

DETAILED DESCRIPTION

Figure 1:
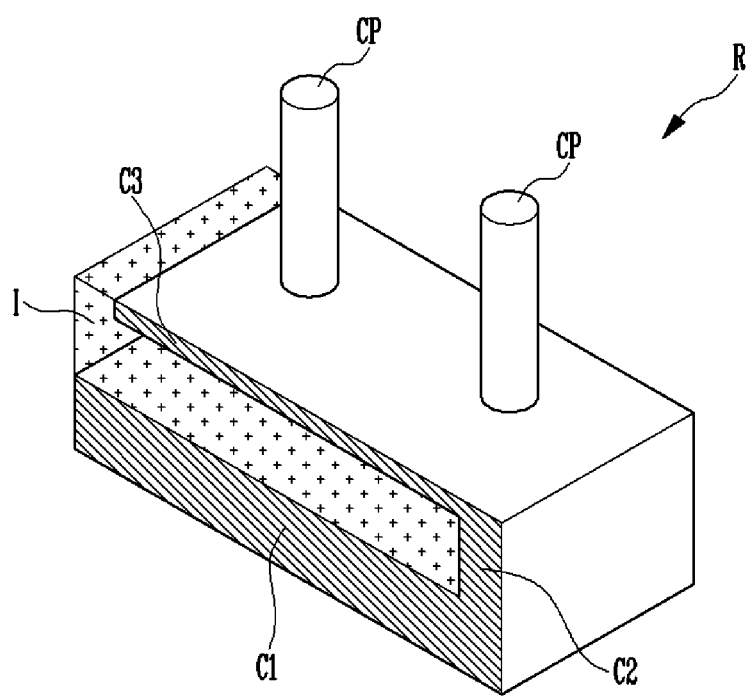
FIG. 1 is a perspective view illustrating a structure of a resistor according to an embodiment of the invention.

The invention will be described more fully with reference to the accompanying drawings, in which embodiments of the invention are shown. This invention may, however, be embodied in different forms and should not be construed as limited to the embodiments set forth.

Rather, these embodiments are provided so that this disclosure will be thorough and complete, and fully convey the scope of the invention to those skilled in the art. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the invention. Like reference numerals refer to like elements throughout the specification and drawings.

Furthermore, "connected" represents that one component is directly electrically coupled to another component or indirectly electrically coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

It should be readily understood that the meaning of "on" and "above" in the disclosure should be interpreted in the broadest manner so that "on" means not only "directly on" but also "on" something with an intermediate feature(s) or a layer(s) therebetween. Further, that "above" means not only directly on top but also on top of something with an intermediate feature(s) or a layer(s) therebetween. Various embodiments of the invention are directed to a semiconductor device having a simplified manufacturing process, a resistor and a method for manufacturing the same. A resistor may have the shape of a left-right asymmetric "C." Furthermore, a resistor may be formed using a process of forming memory cells. Therefore, it is possible to simplify process and reduce the manufacturing costs of a semiconductor device.

Referring to FIG. 1, a perspective view illustrating a structure of a resistor according to an embodiment of the invention is shown. A resistor (R) includes a first conductive layer (C1), second conductive layer (C2), third conductive layer (C3) and contact plugs (CP).

The second conductive layer (C2) is shaped to protrude from the first conductive layer (C1). For example, the second conductive layer (C2) may be located at a side end of the first conductive layer (C1), or in the middle of the first conductive layer (C1). Furthermore, the first conductive layer (C1) and the second conductive layer (C2) may be one layer connected integrally to each other.

The third conductive layer (C3) is electrically coupled to the second conductive layer (C2), and located above the first conductive layer (C1) to face the third conductive layer (C3). Herein, the third conductive layer (C3) may be a layer formed in a separate process from the first and second conductive layers (C1, C2).

The contact plugs (CP) may be electrically coupled to an upper surface of the third conductive layer (C3). Furthermore, an insulating layer (I) may be filled in between the first conductive layer (C1) and the third conductive layer (C3).

In such a structure, the resistor (R) may have a left-right asymmetric structure. For instance, the first to third conductive layers (C1~C3) may have "C" shaped cross-sections. Furthermore, the lengths and widths of the first to third conductive layers (C1~C3) may be adjusted to form a resistor (R) with various resistance values.

Figure 2B:
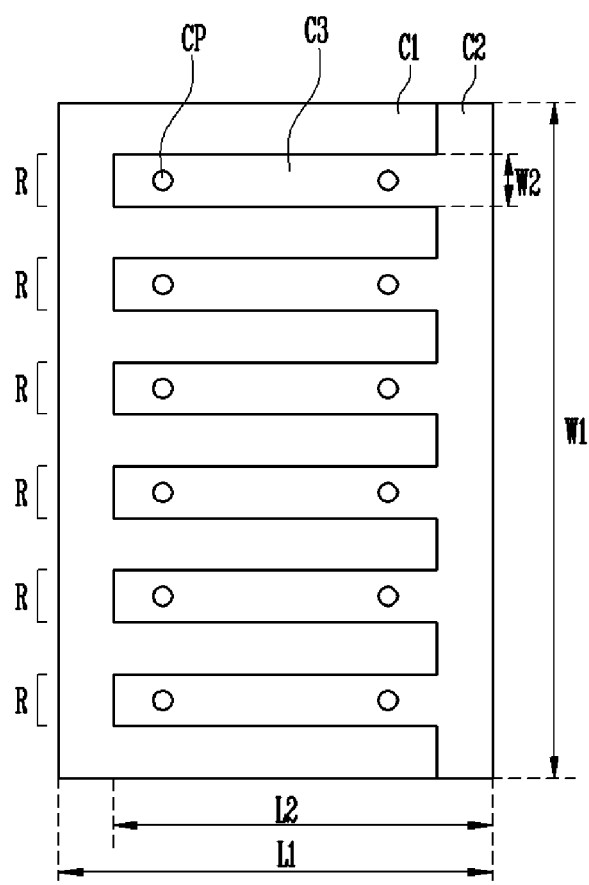
FIG. 2B is a layout of FIG. 2A.

Referring to FIG. 2A, a perspective view illustrating a resistor region of a semiconductor device according to an embodiment of the invention, and FIG. 2B is a layout of FIG. 2A are both shown. In FIGS. 2A and 2B, the semiconductor device includes a first conductive layer (C1), second conductive layer (C2), a plurality of third conductive layers (C3), and a plurality of contact plugs (CP).

The first conductive layer (C1) may have a shape of a plate. The second conductive layer (C2) may have a shape of a plate protruding from the first conductive layer (C1) and expanding in one direction. Furthermore, each of the third conductive layers (C3) may have a shape of a line expanding in a direction intersecting the second conductive layers (C2), each line in parallel to one another.

The plurality of contact plugs (CP) are electrically coupled to the plurality of third conductive layers (C3). In addition, at least two contact plugs (CP) may be electrically coupled to each third conductive layer (C3). Furthermore, an insulating layer may be filled in between the first conductive layer (C1) and the third conductive layers (C3).

According to such a structure, a conductive layer (C1), second conductive layers (C2), and one of the third conductive layers (C3) constitute one resistor (R). Therefore, neighboring resistors (R) may share the first and second conductive layers (C1, C2). Furthermore, the first to third conductive layers (C1~C3) that constitute one resistor (R) may have "C" shaped cross-sections.

The resistor (R) may have various resistance values according to the lengths and widths of the first to third conductive layers (C1~C3). For instance, the first conductive layer (C1) may have a greater length than the third conductive layer (C3) (L1>L2). Furthermore, the first conductive layer (C1) may have a greater width than the third conductive layer (C3) (W1>W2).

FIG. 3A to FIG. 8A and FIG. 3B to FIG. 8B are process cross-sectional views to explain a method to manufacture a semiconductor device according to an embodiment of the invention. FIGS. 3A to 5A illustrate a layout of a resistor region, and FIGS. 3B to 5B illustrate a cross-section along I-I' of FIG. 3A to FIG. 5A. Furthermore, FIG. 6A to 8A illustrate a layout of a cell region, and FIG. 6B to 8B and FIG. 6A to 8A illustrate a cross-section along II-II'.

Figure 3A:
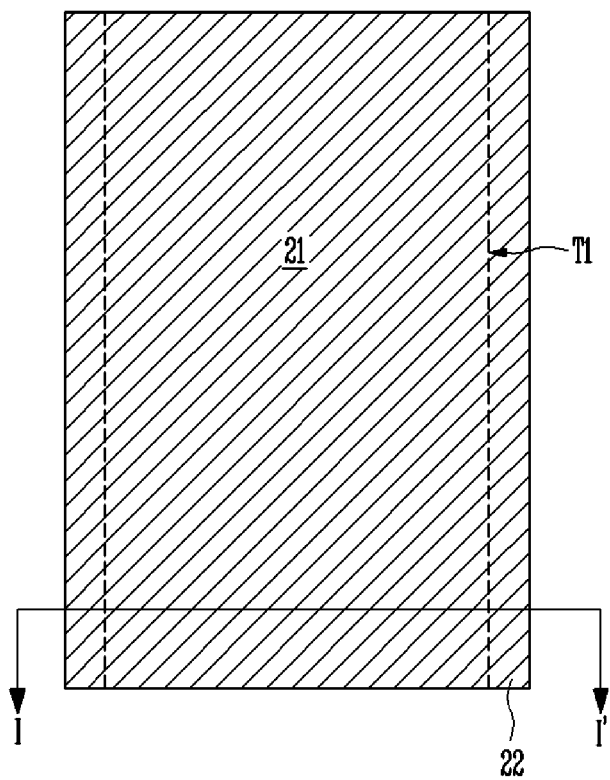
Figure 3B:
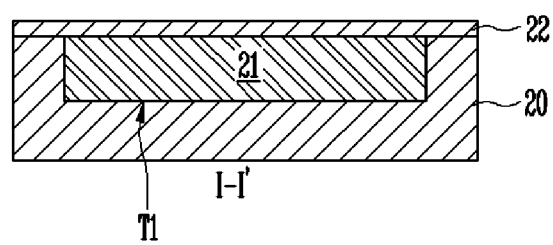

Referring to FIGS. 3A and 3B, a trench (T1) is formed in a first conductive layer 20, and then a sacrificial layer 21 is formed in the first trench (T1). Herein, the first trench (T1) is to secure a region to form an insulating layer in a subsequent process, and a depth, width, and length of the first trench (T1) may be adjusted according to a resistance value of the resistor. For example, the first conductive layer 20 includes silicon and polysilicon, and the sacrificial layer 21 includes nitride, titanium nitride, and tantalum nitride and so forth.

Then, on the first conductive layer 20 where the sacrificial layer 21 is formed, a second conductive layer 22 is formed. The second conductive layer 22 may include silicon, polysilicon and so forth. Furthermore, the second conductive layer 22 may be formed to have a smaller thickness than the first conductive layer 20.

Figure 6A:
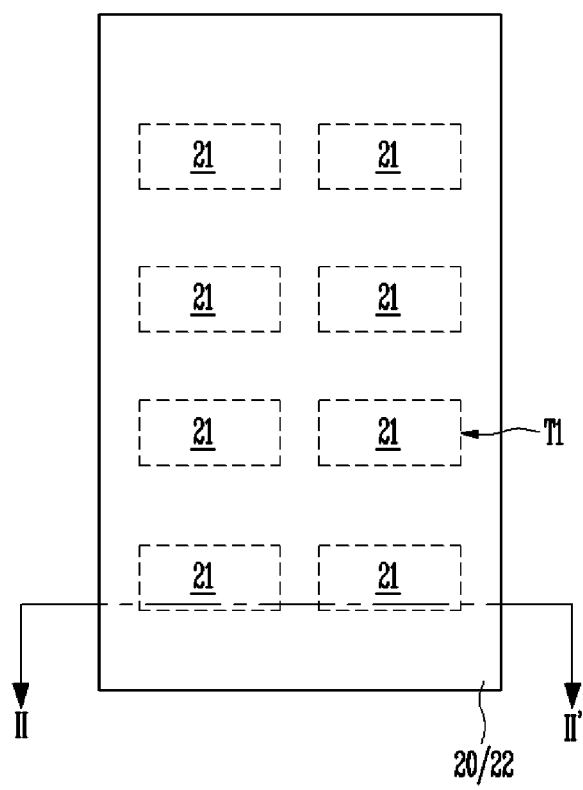
Figure 6B:
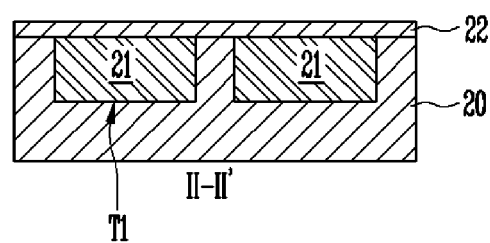

During the process of FIGS. 3A and 3B, the process of FIGS. 6A and 6B may be performed as well. More specifically, a first conductive layer 20 including a first trench (T1) may be formed in not only a resistor region but also in a cell region, and then a sacrificial layer 21 may be formed in the first trench (T1). Herein, the first trench (T1) located in the cell region is to secure a region to form a pipe channel layer. Furthermore, first and second conductive layers 20, 22 located in the cell region may be conductive layers for use in pipe gates.

Figure 4A:
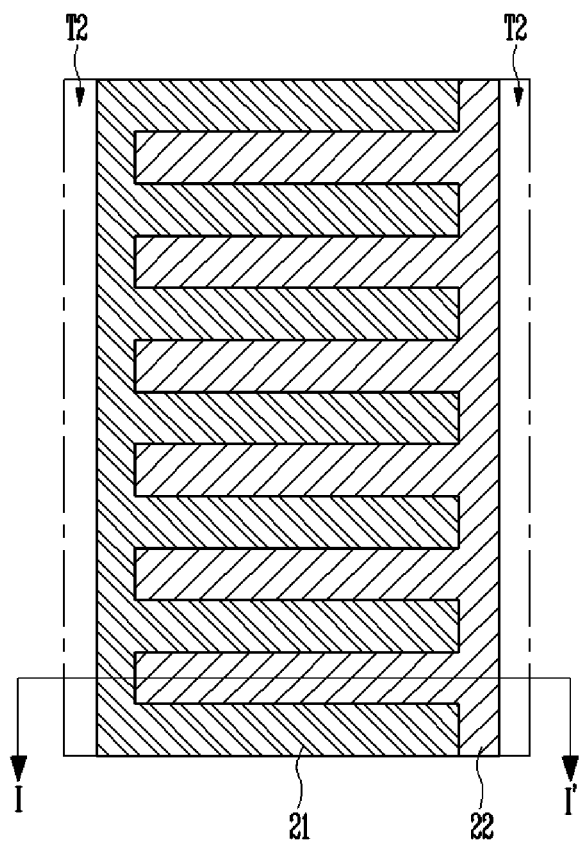
Figure 4B:
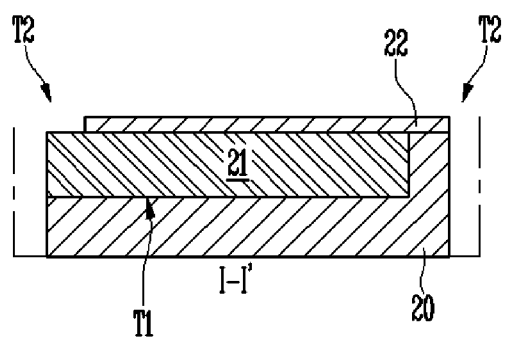

Referring to FIGS. 4A and 4B, a second trench (T2) is formed that penetrates the first and second conductive layers 20, 22 and exposes the sacrificial layer 21. With the second trench (T2), it is possible to pattern the first conductive layer 20 in a plate shape, and the second conductive layer 22 in a plurality of line patterns. For example, the second trench (T2) is formed by etching the first and second conductive layers 20, 22 using a mask pattern having a shape in which the second conductive layer 22 is to be patterned. Herein, the sacrificial layer 21 is used as an etching barrier, and thus the first conductive layer 20 and the second conductive layer 20 may be patterned in different shapes. More specifically, since the first conductive layer 20 below the sacrificial layer 21 is not etched, the first conductive layer 20 may be patterned in a plate shape, and the second conductive layer 22 may be patterned in a plurality of lines.

Figure 7A:
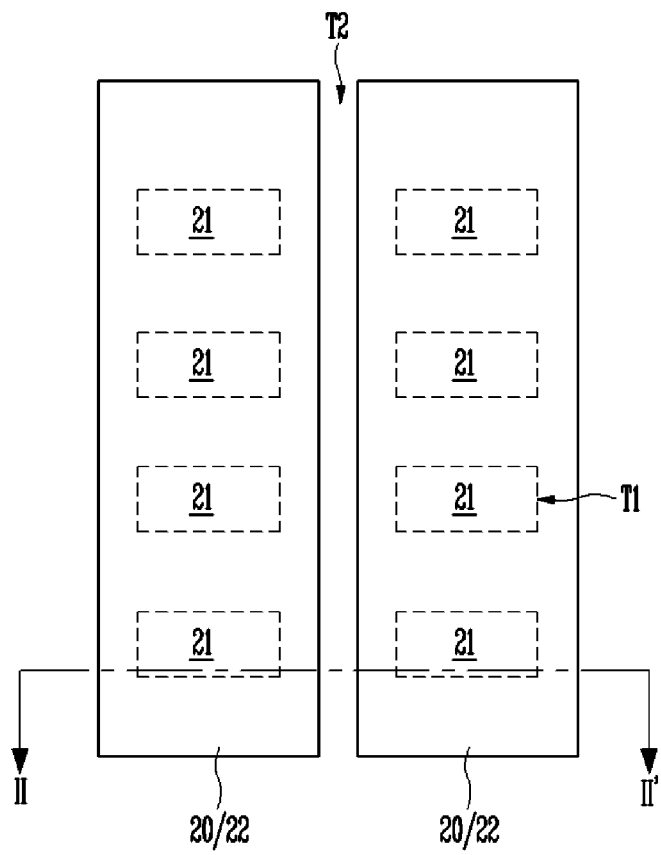
Figure 7B:
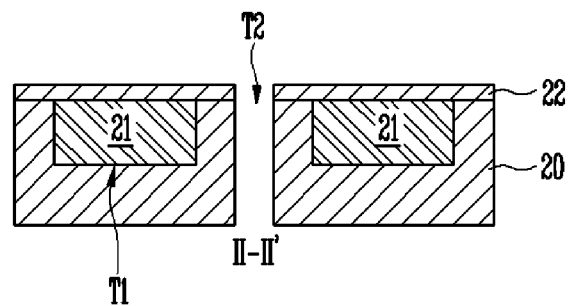

During the process of FIGS. 4A and 4B, the process of FIGS. 7A and 7B may be performed as well. That is, the second trench (T2) may be formed that penetrates the first and second conductive layers 20, 22 in not only the resistor region but also in the cell region. Herein, the second trench (T2) located in the cell region is to pattern a conductive layer for use in pipe gates into pipe gates. Therefore, the second trench (T2) located in the cell region is located between neighboring first trenches (T1), and does not expose the sacrificial layer 21.

Figure 5A:
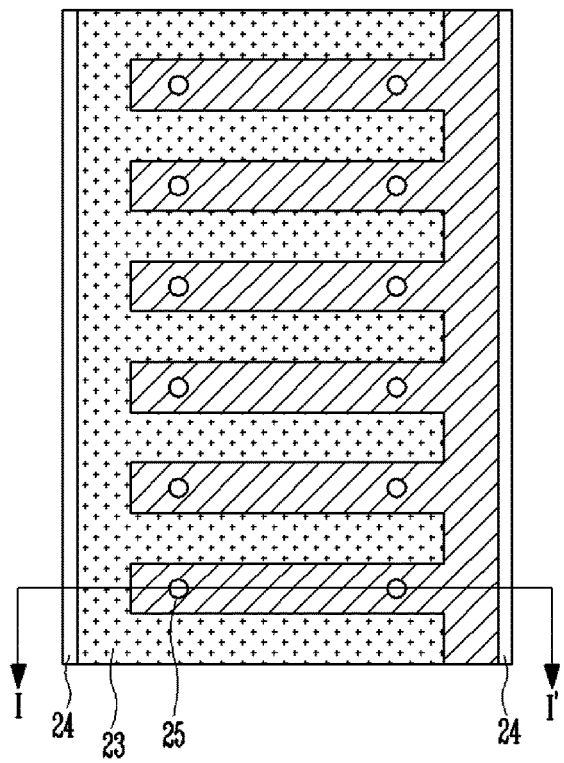
Figure 5B:
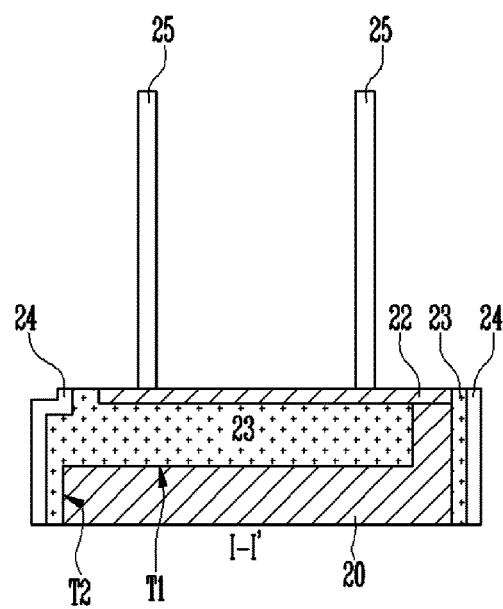

Referring to FIGS. 5A and 5B, the sacrificial layer 21 is removed through the second trench (T2), and then an insulating layer 23 is formed in the first and second trenches (T1, T2). Herein, the insulating layer 23 is formed along a surface of the first and second conductive layers 20, 22 exposed in the first trench (T1) and the second trenches (T1, T2), and thus the insulating layer 23 may have a level difference in a portion of an upper surface. Next, contact plugs 25 are formed above the second conductive layers 22. Accordingly, a resistor having a "C" shaped cross-section is formed. After forming the insulating layer 23, an etch stopping layer 24, for example a nitride layer may be further formed at a side wall of the insulating layer 23.

Figure 8A:
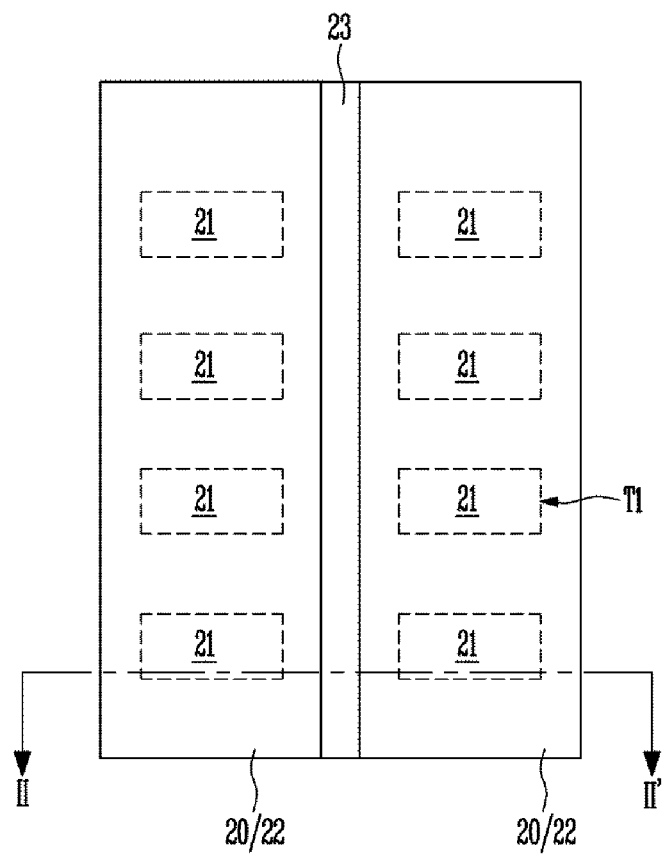
Figure 8B:
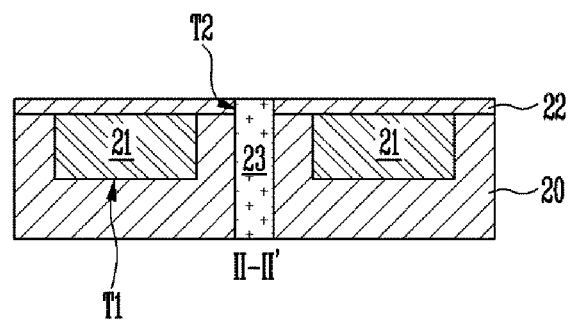

During the process of FIGS. 5A and 5B, the process of FIGS. 8A and 8B may be performed as well. When the sacrificial layer 21 of the resistor region is removed, the sacrificial layer 21 of the cell region is not removed because it is protected by the first and second conductive layers 20, 22. Then, when forming the insulating layer 23, the insulating layer 23 may be formed in the second trench (T2) of the cell region as well. Herein, the insulating layer 23 located in the cell region is used as an isolation layer to separate neighboring pipe gates. Furthermore, since the insulating layer 23 of the cell region completely fills the second trench (T2), an etch stopping layer 24 is not formed in the cell region.

Although not illustrated, an additional process of laminating memory cells above the second conductive layer 22 of the cell region may be performed. For example, the first and second material layers are alternately formed on the second conductive layer 22. Further, apertures are formed that penetrate the first and second material layers and are electrically coupled to the first trench (T1). Then, the sacrificial layer 21 of the cell region is removed through the apertures, and then a memory layer and channel layer are formed in the first trench (T1) and the apertures. Herein, in the case where the first material layers are sacrificial layers and the second material layers are insulating layers, an additional process of replacing the first material layers with conductive layers is performed. Alternatively, in the case where the first material layers are conductive layers such as polysilicon, and the second material layers are insulating layers, an additional process of siliciding the first material layers is performed.

According to the aforementioned process, a pipe gate of the cell region and a resistor of the resistor region may be formed simultaneously. Therefore, without having to perform a separate process, it is possible to form a resistor using a process of forming memory cells laminated in 3-dimensionally. By the aforementioned process, it is possible to simplify the process and reduce the costs of manufacturing a semiconductor device.

Figure 9A:
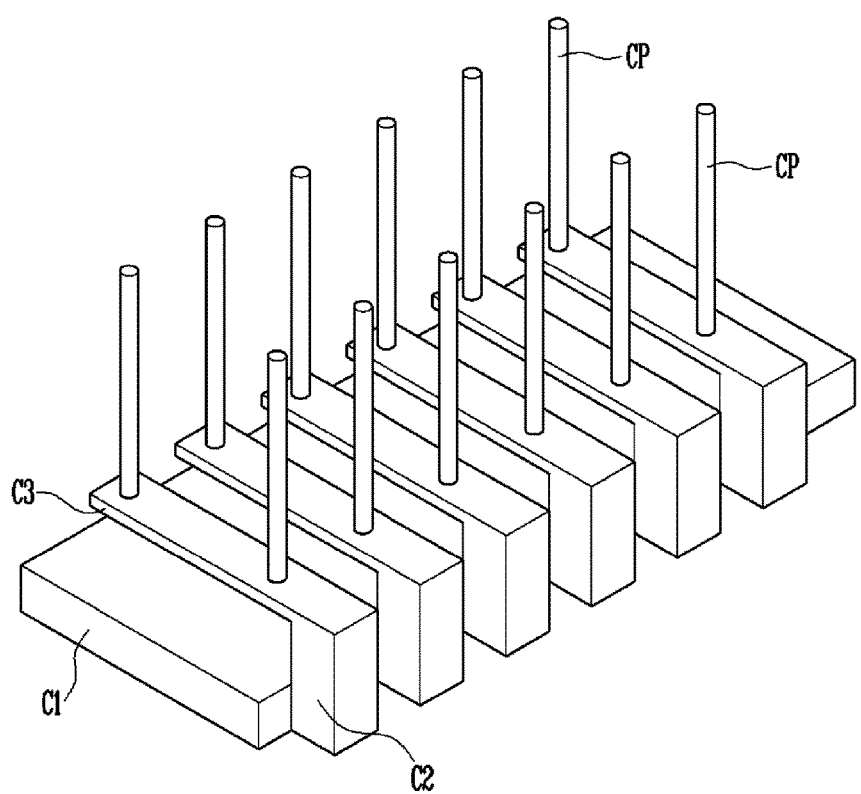
FIG. 9A is a perspective view illustrating a modified example of a resistor region of a semiconductor device according to an embodiment of the invention.

Referring to FIGS. 9A and 9B, perspective views illustrating a modified example of a resistor region of a semiconductor device according to an embodiment of the invention are shown, wherein FIG. 9B is a layout of FIG. 9A. The semiconductor device includes a first conductive layer (C1), a plurality of second conductive layers (C2), a plurality of third conductive layers (C3), and a plurality of contact plugs (CP).

The first conductive layer (C1) may have a plate shape, and each of the second conductive layers (C2) may have a shape of a pillar spaced by a certain distance from one another. Herein, the first conductive layers (C1) may protrude upwards while contacting a side wall of the first conductive layer (C1). Each of the third conductive layers (C3) may have a shape of a line expanding in a direction intersecting the direction in which the second conductive layers (C2) are arranged. Furthermore, although not illustrated in the figures, an insulating layer may be filled in between the first conductive layer (C1) and the third conductive layers (C3) and in between the second conductive layers (C2).

According to such a structure, the first conductive layer (C1) and mutually electrically coupled second conductive layers (C2) and third conductive layers (C3) constitute one resistor (R). Therefore, neighboring resistors (R) may share the first conductive layer (C1). Furthermore, the first to third conductive layers (C1~C3) that constitute one resistor (R) may have "C" shape cross-sections.

A resistor according to an embodiment may be manufactured in the method explained with reference to FIGS. 3A to 5B. For instance, when forming the second trench (T2) explained with reference to FIGS. 4A and 4B, a resistor according to an embodiment may be formed by changing the shape of the mask pattern.

Referring to FIG. 10, a perspective view illustrating a cell region of a semiconductor device according to an embodiment of the invention is shown. The semiconductor device includes a pipe gate (PG), word lines (WL), drain selection lines (DSL), source selection lines (SSL), channel layers (CH), source line (SL), and bit lines (BL).

Herein, the channel layer (CH) includes a pipe channel layer (P_CH) formed in the pipe gate (PG), and a source and drain side channel layers (S_CH, D_CH) electrically coupled to the pipe channel layer (P_CH). Furthermore, the source side channel layer (S_CH) penetrates the word lines (WL) and is electrically coupled to the source line (SL). Further, the drain side channel layer (D_CH) penetrates the word lines (WL) and is electrically coupled to the bit line (BL).

Although not illustrated, a memory layer may be disposed between the channel layer (CH) and the word lines (WL). For example, the memory layer includes a tunnel insulating layer, data storage layer, and charge blocking layer. Furthermore, the data storage layer may include nitride, polysilicon, nanodot, and phase change material etc.

According to such a structure, a drain selection transistor may be formed in a region where the channel layer (CH) intersects the drain selection lines (DSL). In addition, a source selection transistor may be formed in a region where the channel layer (CH) intersects the source selection lines (SSL). Further, memory cells may be formed in a region where the channel layer (CH) intersects the word lines (WL). A pipe transistor may be formed in a region where the pipe channel layer (P_CH) intersects the pipe gate (PG). Therefore, at least one drain selection transistor, drain side memory cells, pipe transistor, source side memory cells and at least one source selection transistor are electrically coupled in series and constitute one string, the strings being arranged in a U shape.

Figure 11:
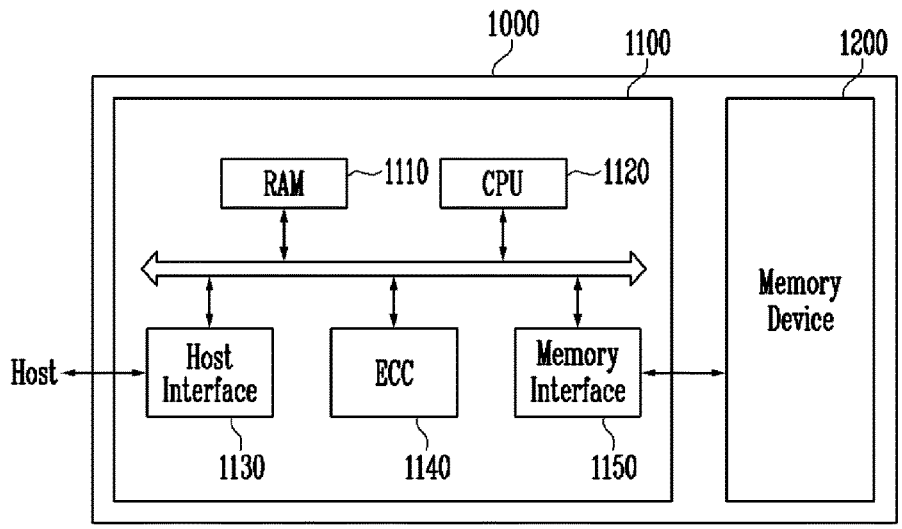
FIG. 11 is a block diagram illustrating a configuration of a memory system according to an embodiment of the invention.

Referring to FIG. 11, a block diagram illustrating a configuration of memory system according to an embodiment of the invention is shown.

A memory system 1000 according to an embodiment of the invention includes a memory device 1200 and a controller 1100.

The memory device 1200 is used to store data information having various data formats such as text, graphic, and software code and so forth. The memory device 1200 may be a nonvolatile memory, and may include the structure explained above referring to FIGS. 1 to 10. Furthermore, the memory device 1200 is configured to include a resistor having a first conductive layer, a second conductive layer protruding from the first conductive layer, a third conductive layer electrically coupled to the second conductive layer and located above the first conductive layer to face the first conductive layer, and at least two contact plugs electrically coupled to the third conductive layers. The structure and manufacturing method of the memory device 1200 are the same as aforementioned, and further explanation is omitted as a result.

The controller 1100 is configured to be electrically coupled to the host and memory device 1200, and to access the memory device 1200 in response to a request from the host. For instance, the controller 1100 is configured to control operations such as reading, writing, muting, and background operations of the memory device 1200.

The controller 1100 includes a RAM (Random Access Memory; 1110), CPU (Central Processing Unit; 1120), Host Interface 1130, ECC circuit (Error Correction Code Circuit; 1140), and Memory Interface 1150.

The RAM 1110 may be used as an operational memory of the CPU 1120, a cache memory between the memory device 1200 and the host, and a buffer memory between the memory device 1200 and the host. The RAM 1110 may be replaced with a SRAM (Static Random Access Memory), or ROM (Read Only Memory) and so forth.

The CPU 1120 is configured to control overall operations of the controller 1100. For instance, the CPU 1120 is configured to operation firmware such as FTL (Flash Translation Layer) stored in the RAM 1110.

The host interface 1130 is configured to perform interfacing with the host. For example, the controller 1100 communicates with the host through at least one of various interface protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol, and private protocol.

The ECC circuit 1140 is configured to detect an error included in data read from the memory device 1200 using an error correction code, and to correct the error.

The memory interface 1150 is configured to perform interfacing with the memory device 1200. For instance, the memory interface 1150 includes a NAND interface or a NOR interface.

The controller 1100 may further include a buffer memory (not illustrated) to temporarily store data. Herein, the buffer memory may be used to temporarily store data transmitted from outside through the host interface 1130 or temporarily state data transmitted from the memory device 1200 through the memory interface 1150. Furthermore, the controller 110 may further include a ROM to store code data to interface with the host.

As such, the memory system 1000 according to an embodiment of the invention includes a memory device 1200 with improved degree of integration, and thus the degree of integration of the memory system 1000 may be improved as well.

Figure 12:
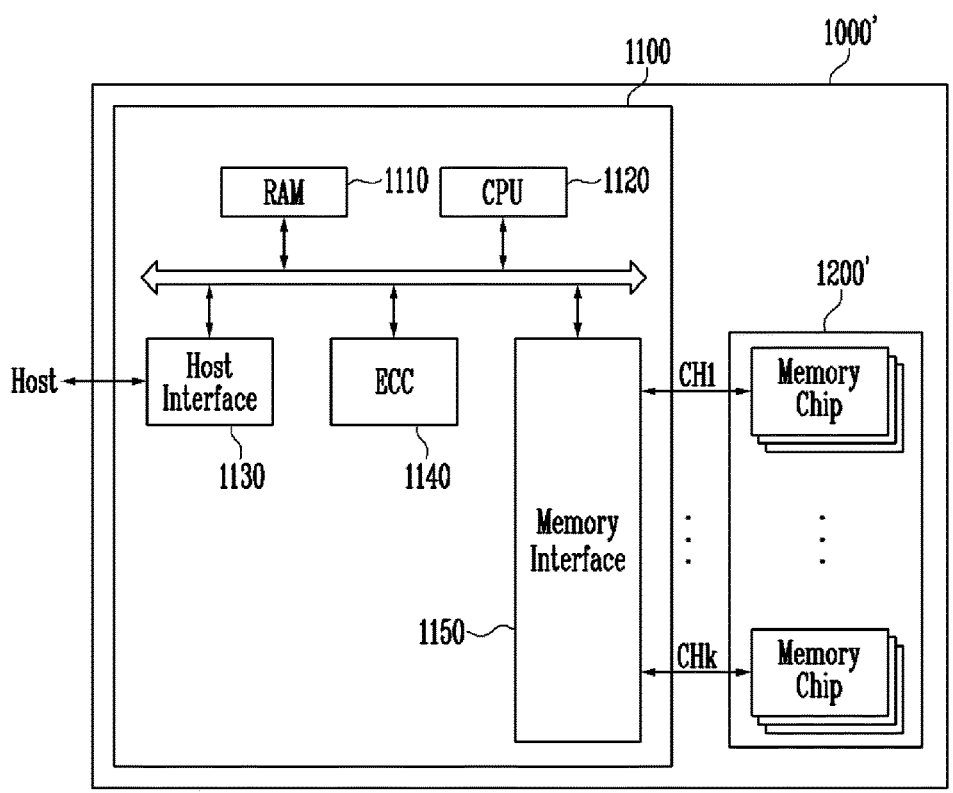
FIG. 12 is a block diagram illustrating a configuration of a memory system according to an embodiment of the invention.

Referring to FIG. 12, a block diagram illustrating a configuration of a memory system according to an embodiment of the invention is shown. Hereinbelow, detailed explanation of the functions and constitutions same as the aforementioned will be omitted accordingly.

The memory system 1000' according to an embodiment of the invention includes a memory device 1200' and a controller 1100. Furthermore, the controller 1100 includes a RAM 1110, CPU 1120, host interface 1130, ECC circuit 1140, and memory interface 1150.

The memory device 1200' may be a nonvolatile memory, and may include a memory string explained above referring to FIGS. 1 to 10. Furthermore, the memory device 1200' is configured to include a resistor having a first conductive layer, a second conductive layer protruding from the first conductive layer, a third conductive layer electrically coupled to the second conductive layer and located above the first conductive layer to face the first conductive layer. The memory device 1200' is also configured to include at least two contact plugs. The structure and manufacturing method of the memory device 1200' are the same as aforementioned, and further explanation is omitted.

Furthermore, the memory device 1200' may be a multi-chip package consisting of a plurality of memory chips. The plurality of memory chips are divided into a plurality of groups configured to communicate with the controller 1100 through 1 to k channels (CH1~CHk). Furthermore, the memory chips belonging to one group are configured to communicate with the controller 1100 through a common channel. The memory system 1000' may be changed such that one memory chip is electrically coupled to one channel.

As such, the memory system 1000' according to an embodiment of the invention includes the memory device 1000' with improved degree of integration. Accordingly, the degree of integration of the memory system 1000' may be improved as well. Especially, by configuring the memory device 1200' as a multi-chip package, it is possible to increase the data storage capacity of the memory system 1000' and increase the driving speed thereof.

Figure 13:
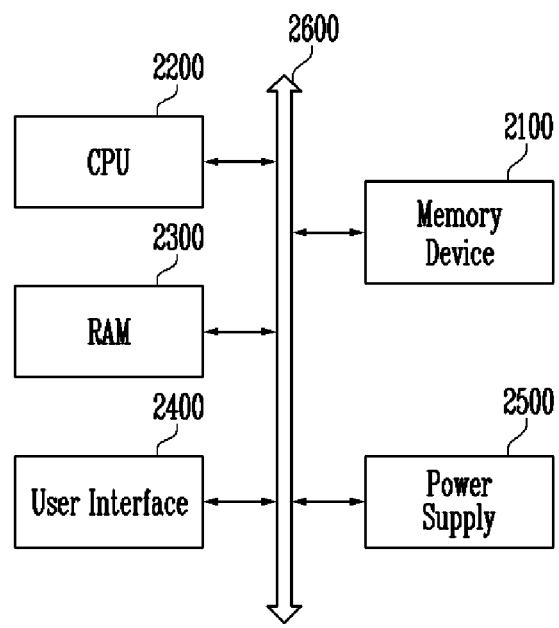
FIG. 13 is a block diagram illustrating a configuration of a computing system according to an embodiment of the invention.

Referring to FIG. 13, a block diagram illustrating a configuration of a computing system according to an embodiment of the invention is shown. Hereinbelow, detailed explanation of the functions and constitutions same as the aforementioned will be omitted.

The computing system 2000 according to an embodiment of the invention includes a CPU 2200, RAM 2300, user interface 2400, power 2500, and system BUS 2600.

The memory device 2100 stores data provided through the user interface 2400 and data processed by the CPU 2200. Furthermore, the memory device 2100 is electrically coupled to the CPU 2200, RAM 2300, user interface 2400, and power 2500 through a system BUS 2600. For example, the memory device 2100 may be electrically coupled to a system BUS 2600 directly or through a controller. In the case where the memory device 2100 is directly electrically coupled to the system BUS 2600, functions of the controller may be performed by the CPU 2200 and RAM 2300.

Herein, the memory device 2100 may be a nonvolatile memory, and may include a memory string explained above referring to FIGS. 1 to 10B. Furthermore, the memory device 2100 is configured to include a resistor having a first conductive layer, a second conductive layer protruding from the first conductive layer, a third conductive layer electrically coupled to the second conductive layer and located above the first conductive layer to face the first conductive layer, and at least two contact plugs. The structure and manufacturing method of the memory device 2100 are the same as aforementioned, and further explanation is omitted.

As explained with reference to FIG. 12, the memory device 2100 may be a multi-chip package consisting of a plurality of memory chips.

The computing system 2000 having such a configuration may be a computer, UMPC (Ultra Mobile PC), workstation, net-book, PDA (Personal Digital Assistants), portable computer, web tablet, wireless phone, mobile phone, smart phone, e-book, PMP (Portable Multimedia Player), portable game player, navigation, black box, digital camera, 3-dimensional television, digital audio recorder, digital audio player, digital picture recorder, digital picture player, digital video recorder, digital video player, a device capable of transceiving information in wireless environments, one of various electronic devices constituting a home network, one of various electronic devices constituting a telematics network, and RFID.

As such, the computing system 2000 according to the embodiment of the invention includes a memory device with improved degree of integration, and thus the data storage capacity of the computing system 200 may be improved.

Figure 14:
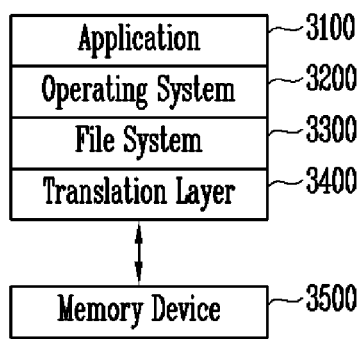
FIG. 14 is a block diagram illustrating a computing system according to an embodiment of the invention.

Referring to FIG. 14, a block diagram illustrating a computing system according to the embodiment of the invention is shown.

A computing system 3000 according to the embodiment of the invention includes an operating system 3200, application 3100, file system 3300, and a software layer including a translation layer 3400. Furthermore, the computing system 3000 includes a hardware layer such as a memory device 3500.

The operating system 3200 is to manage software and hardware resources of the computing system 3000, and the operating system 3200 may control execution of programs of a CPU. The application 3100 may be various application programs executed in the computing system, for example, a utility being executed by the operating system 3200.

The file system 3300 refers to a logical structure to manage data and files existing in the computing system 3000, and the file system 3300 organizes files or data to be stored in the memory device 3500 according to rules. The file system 3300 may be determined according to the operating system 3200 used in the computing system 3000. For instance, in the case where the operating system 3200 is one of Windows series of Microsoft, the file system 3300 may be a FAT (File Allocation Table) or NTFS (NT file system). Furthermore, in the case where the operating system 3200 is one of Unix/Linux series, the file system 3300 may be an EXT (extended file system), UFS (Unix File System), or JFS (Journaling File System).

In FIG. 14, the operating system 3200, application 3100 and file system 3300 are illustrated as separate blocks, but the application 3100 and file system 3300 may be included in the operating system 3200.

The translation layer 3400 translates an address in a format suitable to the memory device 3500 in response to a request from the file system 3300. For example, the translation layer 3400 translates a logic address created in the file system 3300 into a physical address of the memory device 3500. Herein, mapping information of the logic address and physical address may be stored in an address translation table. For instance, the translation layer 3400 may be a Flash Translation Layer (FTL), or Universal Flash Storage Link Layer (ULL) and so forth.

The memory device 3500 may be a nonvolatile memory, and may include a memory string explained with reference to FIGS. 1 to 10B above. Furthermore, the memory device 3500 is configured to include a resistor having a first conductive layer, a second conductive layer protruding from the first conductive layer, a third conductive layer electrically coupled to the second conductive layer and located above the first conductive layer to face the first conductive layer, and at least two contact plugs. The structure and manufacturing method of the memory device 3500 are the same as aforementioned, and further explanation is omitted as a result.

The computing system 3000 having such a configuration may be divided into an operating system layer performed in an upper level region and a controller layer performed in a lower level region. Herein, the application 3100, operating system 3200 and file system 3300 are included in the operating system layer, and these may be driven by an operational memory of the computing system 3000. Furthermore, the translation layer 3400 may be included in the operating system layer or the controller layer.

As such, the computing system 3000 according to an embodiment of the invention includes the memory device 3500 having improved degree of integration. As a result, the data storage capacity of the computing system 3000 may be improved as well.

In the drawings and specification, there have been disclosed typical embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the invention as defined by the following claims.

What is claimed is:

1. A resistor, comprising:
a first conductive layer;
a second conductive layer protruding from one end of the first conductive layer;
a third conductive layer contacts the second conductive layer, wherein the first and third conductive layers extend from the second conductive layer, in parallel to face each other;
an insulating layer filled in between the first conductive layer and the third conductive layer; and
at least two contact plugs electrically coupled to the third conductive layer,
wherein the first conductive layer extends further from the second conductive layer than the third conductive layer, and
wherein the first conductive layer and the second conductive layer are one layer integrally connected and have an "L" shaped cross-section.

2. The resistor according to claim 1, wherein the first conductive layer has a greater width than the third conductive layer.

3. The resistor according to claim 1, wherein the resistor has a "C" shaped cross-section.

4. A semiconductor device comprising:
a first conductive layer;
a second conductive layer integrally protruding from one end of the first conductive layer;
third conductive layers contacting the second conductive layer, wherein the first and third conductive layers extend from the second conductive layer, in parallel to face each other;
an insulating layer filled in between the first conductive layer and the third conductive layers; and
a plurality of contact plugs electrically coupled to the third conductive layers,
wherein the first conductive layer, the second conductive layer and one of the third conductive layers constitute a resistor so that a plurality of resistors share the first conductive layer and the second conductive layer, and
wherein the first conductive layer extends further from the second conductive layer than the third conductive layer.

5. The semiconductor device according to claim 4, further comprising:
a pipe gate located in a cell region, and made of a same material as the first conductive layer.

6. The semiconductor device according to claim 4, wherein each of the resistors has a "C" shaped cross-section.

7. The semiconductor device according to claim 4, wherein the first conductive layer and the second conductive layer have an "L" shaped cross-section.

* * * * *